US005351375A

United States Patent [19]

Ochiai et al.

[11] Patent Number: 5,351,375

[45] Date of Patent: Oct. 4, 1994

[54] METHOD FOR FABRICATING INK JET PRINTHEAD

[75] Inventors: Kuniaki Ochiai; Shigeo Komakine, both of Shizuoka, Japan

[73] Assignee: Tokyo Electric Co., Ltd., Tokyo, Japan

[21] Appl. No.: 145,183

[22] Filed: Nov. 3, 1993

Related U.S. Application Data

[62] Division of Ser. No. 872,352, Apr. 23, 1992, Pat. No. 5,311,219.

[30] Foreign Application Priority Data

Oct. 4, 1991 [JP] Japan .................................. 3-257531

[51] Int. Cl.[5] ............................................. H01L 41/22

[52] U.S. Cl. .................................. 29/25.35; 29/890.1; 310/330

[58] Field of Search ............................ 29/25.35, 890.1; 346/140 R; 310/330-333

[56] References Cited

U.S. PATENT DOCUMENTS 5,193,256 3/1993 Ochiai et al. ........................ 29/25.35

5,265,315 11/1993 Hoisington et al. ............... 29/25.35

*Primary Examiner*—Carl E. Hall

*Attorney, Agent, or Firm*—Oblon, Spivak, McClelland, Maier & Neustadt

[57] ABSTRACT

An adhesive layer 15 is formed over one major surface of a flat base plate 1 having a relatively high rigidity, a piezoelectric plate 2 is joined to the adhesive layer 15, a plurality of parallel grooves 3 are formed through the piezoelectric plate 2 into the adhesive layer 15, a metal is deposited over the surfaces of the grooves 3 to form electrodes 8, a top plate 10 is attached to the upper surface of the piezoelectric plate 2 so as to close the upper open ends of the grooves 3, and a nozzle plate 12 provided with a plurality of ink jets is attached to one end of the assembly of the base plate 1, the adhesive layer 15, the piezoelectric plate 2 and the top plate 10 so as to close the open longitudinal ends of the grooves 3 to form a plurality of pressure chambers 14. The upper side walls **4*a* of side walls 4 separating pressure chambers 14 from each other are formed of portions of the piezoelectric plate 2 and the lower side walls 4*b* of the side walls 4 are formed of portions of the adhesive layer 15 having a rigidity lower than that of the piezoelectric plate 2. Accordingly, the side walls 4** can be strained greatly. The electrodes 8 formed by electroless plating have few pinholes.

4 Claims, 7 Drawing Sheets

METHOD FOR FABRICATING INK JET PRINTHEAD

This is a division of application Ser. No. 07/872,352, filed on Apr. 23, 1992, now U.S. Pat. No. 5,311,219.

FIELD OF THE INVENTION AND RELATED ART STATEMENT

The present invention relates to an on-demand ink jet print head and a method of fabricating the same.

FIG. 10 shows an ink jet print head of an invention disclosed in Japanese Patent Laid-open (Kokai) No. Hei 2-150355. Referring to FIG. 10, a bottom sheet 30 having a polarity indicated by arrows is provided with a plurality of parallel grooves 31 defined by side walls 32 and a bottom wall 33. A top sheet 35 is attached adhesively by an adhesive layer 36 to the upper ends 34 of the side walls 32 to close the open upper ends of the grooves 31. Upper portions of the side surfaces of the side walls 32, namely, the side surfaces of each groove 31, of a length corresponding to substantially half the depth of the groove 31 are metallized by evaporation to form electrodes 37.

The bottom sheet 30 is held on a jig in a vacuum evaporation apparatus and parallel atomic beams of a metal are projected on one side surface of each side wall 32 of the bottom sheet 30 at an angle $\delta$ to the same side surface of each side wall 32 as shown in FIG. 11 to deposit a metal film, i.e., the electrode 37, on the side surface of each side wall 32. Then, the bottom sheet 30 is turned through an angle of 180° in a horizontal plane, as viewed in FIG. 11, and the bottom 30 is subjected to the same vacuum evaporation process to deposit a metal film, i.e., the electrode 37, on the other side surface of each side wall 32. Metal films deposited on the upper ends 34 of the side walls 32 are removed in the next process.

The grooves 31 are closed by the top sheet 35 to form pressure chambers. Then, an ink inlet opening to be connected to an ink supply unit is formed in one end of each pressure chamber, and an ink jet through which ink is jetted is formed in the other end of the pressure chamber to complete an ink jet print head.

When voltages of opposite polarities are applied to the electrodes 37 of the two adjacent side walls 32, shearing strains as indicated by dotted lines in FIG. 10 result from a potential of a direction perpendicular to the direction of polarity of the bottom sheet 30 indicated by the arrows acting on the side walls 32. Consequently, the volume of the pressure chamber (the groove 31) between the sheared side walls 32 is reduced instantaneously and thereby the internal pressure of the pressure chamber is increased sharply to jet the ink through the ink jet.

FIGS. 12(*a*) and 12(*b*) show an ink jet print head of an invention disclosed in Japanese Patent Laid-open (Kokai) No. Sho 63-247051. Referring to FIG. 12(*a*), a bottom wall 38, a hard side wall 39, a top wall 40 and an actuator 41 are combined so as to form a passage 42. The actuator 41 is formed of a piezoelectric ceramic and is polarized in a direction along a Z-axis. A strip seal 43 is attached to the upper end of the actuator 41 so as to be held between the actuator 41 and the top wall 40. The lower end of the actuator 41 is joined to the bottom wall 38. Electrodes 44 and 45 are formed on the opposite side surfaces of the actuator 41. A nozzle 46 is provided at the front end of the passage 42. When ink is supplied from an ink supply unit into the passage 42 and an electric field is applied to the electrodes 44 and 45, the actuator 41 is strained as shown in FIG. 12(*b*) to compress the passage 42 and, consequently, the ink is jetted through the nozzle 46.

The ink jet print head disclosed in Japanese Patent Laid-open (Kokai) No. Hei 2-150355 has the following four disadvantages.

First, the side walls 32 cannot sufficiently be strained (deformed). The side wall 32 is strained by an electric field of a direction perpendicular to the direction of polarization of the bottom sheet 30 created by applying a voltage across the opposite electrodes 37 formed on the upper halves of the side surfaces of the side walls 32 on the opposite sides of the groove 31. Then, the strain of the upper half portion of the side wall 32 provided with the electrodes 37 is sustained by the lower half portion of the same not provided with any electrode 37. Accordingly, the lower half portion of the side wall 32 acts as a resistance against the straining of the upper half portion of the same side wall 32. Since the side wall 32 is a solid body formed of a single material (piezoelectric material) and having a high rigidity, it is impossible to strain the side wall 32 greatly and hence the variation in volume of the pressure chamber is relatively small.

Secondly, the ink jet print head requires a costly process for forming the electrodes 37. Since the electrodes 37 must be formed only in the upper half portions of the side surface of the side walls 32, a special vacuum evaporation apparatus having a complicated construction must be used for forming the electrodes 37. Furthermore, the process of forming the electrodes 37 must be carried out in a plurality of steps of projecting the parallel atomic beams of a metal on one side of each side wall 32 at the predetermined angle $\delta$ to the side surface to form the electrode 37 on one side surface of each side wall 32, turning the bottom sheet 30 through an angle of 180° in a horizontal plane, and projecting the parallel atomic beams of a metal gain on the other side surface of each side wall 32 at the predetermined angle $\delta$ to the side surface to form the electrode 37 on the other side surface of each side wall 32.

Thirdly, it is impossible to apply an electric field uniformly to the bottom sheet 30 formed of a piezoelectric material. A piezoelectric work for forming the bottom sheet 30, in general, is a sintered work consisting of crystal grains. Therefore, crystal grains appear in the side surfaces of the grooves 31 finished by grinding to form irregularities in the side surfaces of the grooves 31. On the other hand, in forming the electrodes 37, no metal is deposited on portions of the side surfaces of the grooves 31 nor facing directly to the atomic beam projecting source of the vacuum evaporation apparatus. Accordingly, the metal is deposited only on projections in the ground side surfaces of the grooves 31 and pinholes are formed at positions corresponding to pits between the projections, which makes it impossible to apply an electric field uniformly to the bottom sheet 30.

Fourthly, the ground side surfaces of the grooves 31 are subject to the corrosive action of the ink and hence the ground side surfaces of the grooves 31 must be coated with a protective film, which, however, is difficult. The ground side surfaces of the grooves 31 of the sintered bottom sheet 30 consisting of crystal grains is subject to the corrosive action of the ink. However, it is possible to coat the side surfaces of the grooves 31 partially with the electrodes 37 having many pinholes, and hence the electrodes 37 are unable to serve as satisfactory protective films.

The ink jet print head disclosed in Japanese Patent Laid-open (Kokai) No. Sho 63-247051 has the following disadvantages.

First, many strip seals 43 having a shape corresponding to the sectional shape of the actuators 41 must be attached to the upper ends of the actuators 41, which requires much time and labor.

Secondly, although the inner surfaces of the bottom wall 38, the hard side wall 39 and the actuator 41 are exposed to the ink, no protective measures are taken to protect the inner surfaces from the corrosive action of the ink. The top wall 40 can be formed of a corrosion-resistant material chosen among relatively many possible materials and the surface of the plate-shaped top wall 40 can relatively easily be coated with a protective film. However, the bottom wall 38, the hard side wall 39 and the actuator 41 are formed by forming the passage 42 in a solid piezoelectric ceramic block, and the electrode 45 must be formed on the inner surface of the actuator 41. Only a possible process of forming the electrode 45 on the inner surface of the actuator 41 may be, in view of the size of the passage, is a vacuum evaporation process or a sputtering process. Accordingly, pinholes are formed inevitably in the electrode 45. The bottom wall 38 and the hard side wall 39 are exposed to the corrosive action of the ink. Such problems may be solved if the inner surfaces are coated with a protective film. However, it is impossible to coat the irregular inner surfaces of the bottom wall 38, the hard side wall 39 and the actuator 41 entirely with a protective film by an ordinary vacuum evaporation process or a sputtering process, because the metal is deposited only on surfaces directly facing the source metal.

OBJECT AND SUMMARY OF THE INVENTION

Accordingly, it is a first object of the present invention to provide an ink jet print head provided with pressure chambers having a large volume contraction ratio.

A second object of the present invention is to provide an ink jet print head facilitating the formation of electrodes therein.

A third object of the present invention is to provide an ink jet print head provided with electrodes having few pinholes.

A fourth object of the present invention is to provide an ink jet print head having pressure chambers defined by surfaces effectively coated with a protective film.

An ink jet print head in a first aspect of the present invention comprises: a piezoelectric plate formed of a piezoelectric material, polarized in the direction of its thickness and provided with a plurality of slots separated from each other by upper side walls; a base plate formed of a nonconductive, nonelectrostrictive material having a rigidity lower than that of the piezoelectric material forming the piezoelectric plate, provided with grooves separated from each other by lower side walls and joined to the piezoelectric plate so that the grooves are aligned respectively with the slots of the piezoelectric plate and the lower side walls are connected respectively to the upper side walls to form side walls to form pressure chambers; a plurality of electrodes each formed over the entire bottom surface of the groove and the side surfaces of the side walls; a top plate joined to the upper surface of the piezoelectric plate so as to seal the pressure chambers; and a nozzle plate provided with a plurality of ink jets and joined to one end of the assembly of the base plate, the piezoelectric plate and the top plate so that the ink jets correspond respectively to the pressure chambers. The volume of the pressure chamber is reduced to increase the internal pressure of the pressure chamber to jet the ink through the ink jet by applying a voltage to the electrodes so that the side walls of the pressure chamber are deformed. Since the upper side wall, i.e., one portion of the side wall on the side of the top plate, is formed of the piezoelectric material having a high rigidity and the lower side wall, i.e., the other portion of the side wall on the side of the base plate, is formed of a material having a rigidity lower than that of the piezoelectric material, the resistance of the lower side wall against the deformation of the upper side wall is relatively low, so that the side wall is able to be deformed greatly to enhance the ink jetting characteristic of the ink jet print head. Since the adhesive layer and the piezoelectric plate are mounted on the base plate having a high rigidity, the grooves can be formed in a correct depth with small errors and hence the side walls are uniform in straining characteristic and the pressure chambers are uniform in ink jetting characteristic.

A method of fabricating an ink jet print head in a second aspect of the present invention comprises steps of: forming an adhesive layer in a uniform thickness over one major surface of a base plate having a high rigidity and resistant to thermal deformation; joining a piezoelectric plate polarized in the direction of its thickness to the adhesive layer; hardening the adhesive layer; forming a plurality of grooves through the piezoelectric plate into the adhesive layer by grinding; depositing a metal over the entire inner surfaces of the grooves by electroless plating to form electrodes; and attaching a top plate to the piezoelectric plate so as to close the open upper ends of the grooves to form a plurality of pressure chambers communicating with an ink supply unit. The electrodes having few pinholes can be formed in a uniform thickness over the entire inner surfaces of the grooves formed in the piezoelectric plate and the adhesive layer by electroless plating even if there are irregularities in the ground surfaces of the grooves and hence an electric field can uniformly be applied to the piezoelectric plate. Since the bottom surface and the side surfaces of each pressure chamber are coated uniformly with the electrodes having few pinholes, the corrosion of the inner surfaces of the pressure chamber by the ink can be prevented and a process for forming a protective film can be omitted to reduce the cost of the ink jet print head.

A method of fabricating an ink jet print head in a third aspect of the present invention comprises steps of: joining together a base plate and a piezoelectric plate with an adhesive layer of an adhesive containing particles readily soluble in a chemical liquid; forming grooves through the piezoelectric plate into the adhesive layer; etching portions of adhesive layer exposed in the inner surfaces of the grooves; and forming electrodes on the inner surfaces of the grooves by electroless plating. Since the particles contained in the adhesive layer dissolve in a chemical liquid which is used for a pretreatment before etching, minute pits are formed in the portions of the adhesive layer exposed in the surfaces of the grooves, and the minute pits improve the adhesion of the electrodes to the exposed surfaces of the adhesive layer.

A method of fabricating an ink jet print head in a fourth aspect of the present invention employs an adhesive containing nuclei of a catalyst necessary for electroless plating for forming the adhesive layer. Metal deposits on the nuclei of the catalyst during electroless plating, so that the adhesion of the electrodes to the surfaces of the grooves can be enhanced.

A method of fabricating an ink jet print head in a fifth aspect of the present invention a catalyst for electroless plating to the inner surfaces of the grooves formed through the piezoelectric plate into the adhesive layer by grinding and to the surface of the piezoelectric plate, forms a mask by a photolithographic process so that the surface of the piezoelectric plate excluding portions thereof in which the electrodes and a wiring pattern are to be formed, and immerses a work consisting of the base plate, the piezoelectric plate and the adhesive layer in an electroless plating bath to form the electrodes and the wiring pattern simultaneously, which reduces the number of steps of the process of fabricating the ink jet print head.

DETAILED DESCRIPTION OF THE PREFERRED EMBODIMENTS

Figure 1:
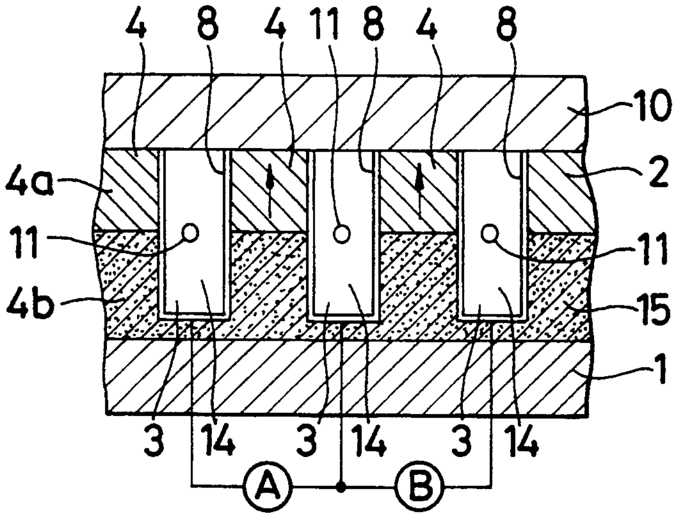
FIG. 1 is a longitudinal sectional view of an ink jet print head in a preferred embodiment according to the present invention.

An ink jet print head in a preferred embodiment according to the present invention will be described hereinafter with reference to FIGS. 1 to 9. First, steps of fabricating the ink jet print head will be described with reference to FIGS. 3(*a*) to 5(*c*). Referring to FIG. 3(*a*), an adhesive layer 15 of an adhesive containing an epoxy resin having high bonding strength as a principal component is formed over a base plate 1 of aluminum or glass having high rigidity and resistant to thermal deformation. A piezoelectric plate 2 polarized in the direction of its thickness is put on the adhesive layer 15 and the adhesive layer 15 is hardened to form a work consisting of the base plate 1, the piezoelectric plate 2 and the adhesive layer 15. The thickness of the piezoelectric plate 2 is 130 μm. The thickness of the base plate 1 is dependent on the thickness of the piezoelectric plate 2 and the depth of grooves to be formed through the piezoelectric plate 2 into the adhesive layer 15. The adhesive forming the adhesive layer 15 is a nonconductive industrial adhesive. Bubbles contained in the adhesive reduces the bonding strength of the adhesive and hence, if necessary, the adhesive is deaerated. The characteristics of the piezoelectric plate 2 is deteriorated if the same is heated above a predetermined temperature because the piezoelectric plate 2 is polarized. Therefore, the adhesive forming the adhesive layer 15 bonding together the base plate 1 and the piezoelectric plate 2 is an adhesive capable of hardening at a hardening temperature that will not deteriorate the characteristics of the piezoelectric plate 2. The adhesive employed in this embodiment is SCOTCH WELD 1838B/A® (Sumitomo 3M K.K.).

Referring to FIG. 3(*b*), a plurality of parallel grooves 3 are formed at predetermined intervals through the piezoelectric plate 2 into the adhesive layer 15 by grinding. Before forming the grooves 3 by grinding, the bottom surface of the base plate 1 is ground with reference to the surface of the piezoelectric plate 2 to finish the work in a predetermined thickness, the work is fixed to the bed of a grinding machine with the flat bottom surface of the base plate 1 having high rigidity in close contact with the surface of the bed, and the feed of the grinding machine is determined with reference to the surface of the bed to form the grooves 3 in a predetermined depth. Naturally, the depth of the grooves 3 may be determined with reference to the surface of the piezoelectric plate 2 to omit the process of grinding the bottom surface of the base plate 1. The grooves 3 are separated from each other by side walls 4. Each side wall 4 consists of an upper side wall 4*a* formed of the piezoelectric material of the piezoelectric plate 2, and a lower side wall 4*b* formed of the adhesive layer 15 having a rigidity lower than that of the piezoelectric plate 2. In this embodiment, the grooves 3 are 80 μm in width and 160 μm in depth. The pitch of the grooves 3 is 169 μm. Generally, a diamond wheel employed in a dicing saw for dicing wafers to provide IC chips is used for forming the grooves 3. In this embodiment, a 2 in. diameter diamond wheel NBCZ1080° or NBCZ1090° (K.K. Disuko) was used. The diamond wheel was rotated at 30,000 rpm in forming the grooves 3.

The work consisting of the base plate 1, the adhesive layer 15 and the piezoelectric plate 2 is washed for pretreatment before forming electrodes by electroless plating, in which the surfaces of the work are cleaned and conditioned with an cationic surface active agent for degreasing and improving the catalyst adsorbing property of the surfaces. Then, the work is immersed in a catalyst bath containing a neutral salt, such as NaCl, Pd and Sn after washing, the work is treated by an acid accelerator, so that only Pd as a catalyst remain over the surfaces of the work, and then, the work is dried. It is desirable to employ an ultrasonic device to make the solution permeate the surfaces of the grooves 3 perfectly.

Figure 3A:
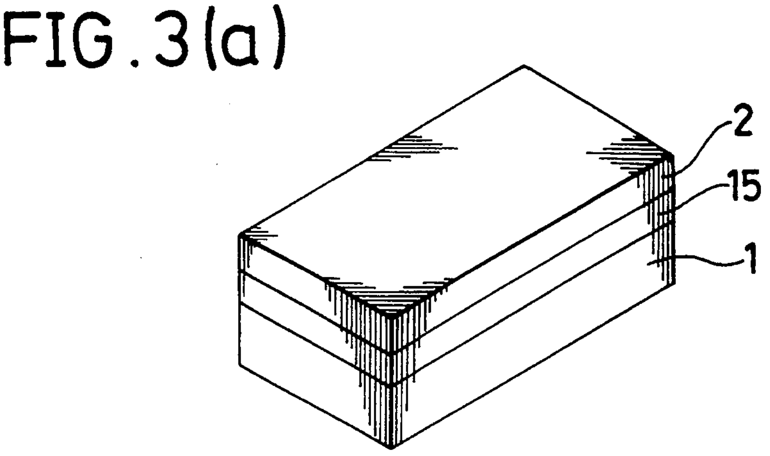
FIGS. 3(*a*) to 3(*c*) are perspective views of assistance in explaining steps of fabricating the ink jet print head of FIG. 1.
Figure 3B:
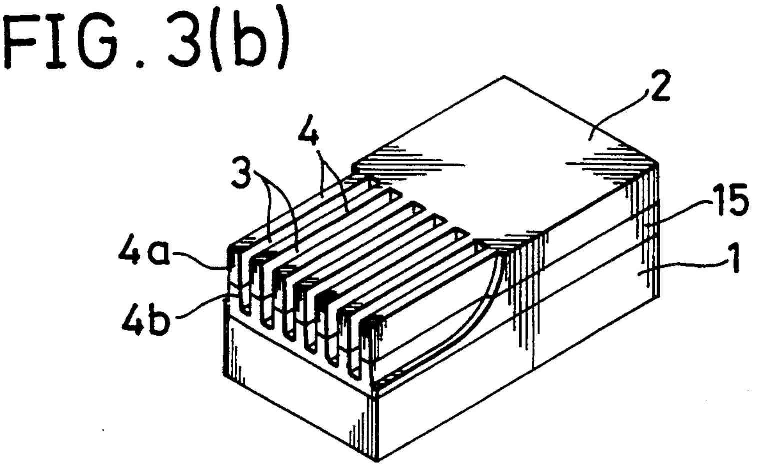
Figure 3C:
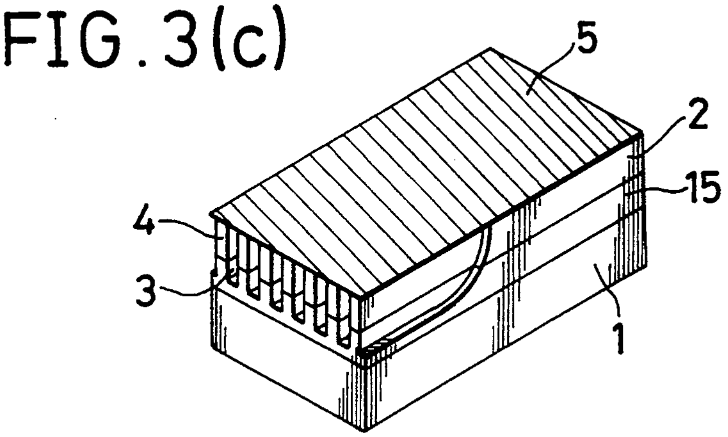
Figure 4A:
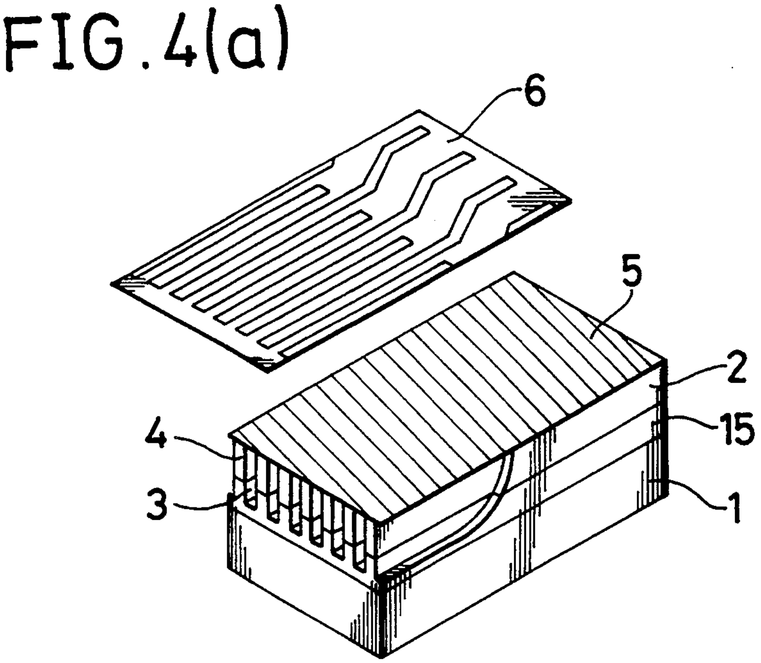
FIGS. 4(*a*) and 4(*b*) are perspective views of assistance in explaining steps of fabricating the ink jet print head of FIG. 1.
Figure 4B:
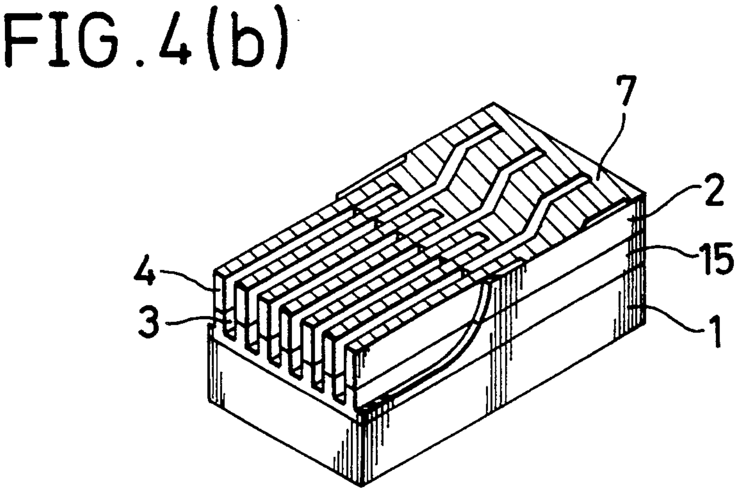

Then, a mask is formed over the surface of the piezoelectric plate 2. The mask covers portions of the surface of the piezoelectric plate 2 excluding those in which electrodes and wiring pattern of a conductive film are to be formed. In forming the mask, a dry film 5 is applied to the surface of the piezoelectric plate 2 as shown in FIG. 3(*c*), a mask 6 is placed on the dry film 5 as shown in FIG. 4(*a*) and the dry film 5 is exposed to light and the exposed dry film 5 is subjected to developing. Resist films 7 are formed over the surface of the piezoelectric plate 2 excluding portions in which electrodes and a wiring pattern of a conductive film are to be formed. The surfaces of the portions in which electrodes and a wiring pattern of a conductive film are to be formed are coated with Pd, i.e., a catalyst.

Figure 5A:
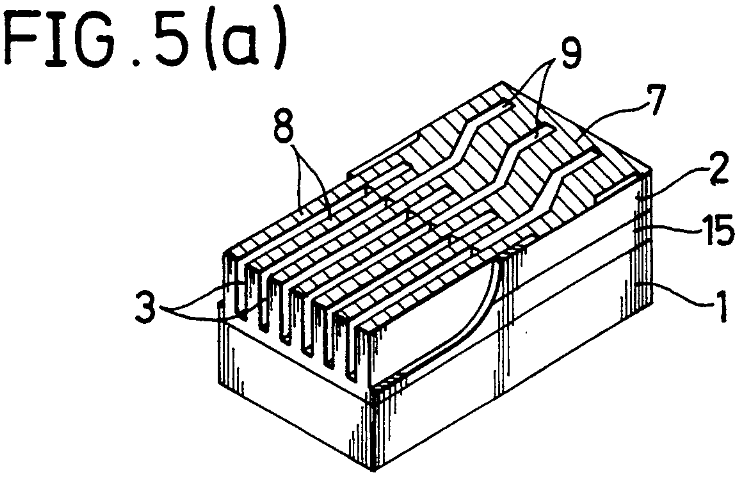
FIGS. 5(a) to 5(c) are perspective views of assistance in explaining steps of fabricating the ink jet print head of FIG. 1.
Figure 5B:
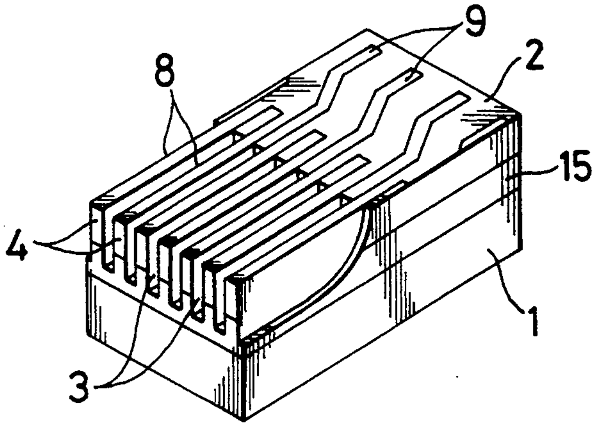
Figure 5C:
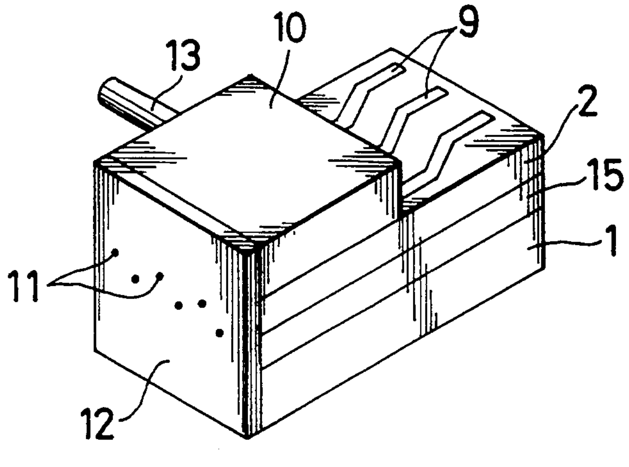

Then, the work is immersed in a plating bath for electroless plating. The portions of the surface of the work other than those in which electrodes and a wiring pattern are to be formed are isolated from the plating bath by the resist film 7. Suitable metals to be deposited by electroless plating are gold and nickel. The plating bath contains a metallic salt and a reducing agent as principal components, and additives such as a pH regulator, a buffer, a complexing agent, an accelerator, a stabilizer and a modifier. In this embodiment, a low-temperature Ni-P plating bath is used. A layer of metal is formed by electroless plating in a thickness in the range of 2 to 3 $\mu$m. Since electroless plating, differing from electroplating, is a chemical process, the mode of deposition of the metal can simply be controlled by regulating the pH and the concentration of the components of the plating bath. When the work is immersed in the plating bath, Pd (catalyst) spread over the surface of the portions not coated with the resist films 7 acts as catalyst and the metal is deposited in those portions of the surface of the work. After Pd has been coated with a film of the deposited metal, the autocatalysis of the deposited metal promotes electroless plating. When the metal is deposited in a film of a desired thickness, the electroless plating process is terminated. Thus, electrodes 8 are formed over the entire side surfaces of the side walls 4 defining the grooves 3 and not coated with the resist film 7, and a wiring pattern 9 continuous with the electrodes 8 is formed in the portions of the surface of the piezoelectric plate 2 not coated with the resist film 7 as shown in FIG. 5(*a*). Since the plating bath permeates the minute structure of the surface of the piezoelectric plate 2 and the adhesive layer 15 and few pinholes are formed in the films of the deposited metal, the side surfaces of the side walls 4 formed of the adhesive layer 15 and the piezoelectric plate 2 having a poor water resisting property are protected from the corrosive action of the ink. Accordingly, any additional protective film is unnecessary. The electrodes 8 and the wiring pattern 9 are formed in a uniform thickness. Then, as shown in FIG. 5(*b*), the resist films 7 are removed from the surface of the piezoelectric plate 2.

Then, as shown in FIG. 5(*c*), a top plate 10 is attached adhesively to the upper surface of the piezoelectric plate 2. Since the resist films 7 of about 20 $\mu$m in thickness, which is thicker than the metal film formed by electroless plating, have been removed, the top plate 10 can satisfactorily be attached to the upper surface of the piezoelectric plate 2. A nozzle plate 12 provided with a plurality of ink jets 11 is attached to one end of the assembly of the base plate 1, the piezoelectric plate 2, the adhesive layer 15 and the top plate 10 so that the ink jets 11 correspond respectively to the grooves 3 to complete the ink jet print head. The grooves 3 are closed by the top plate 10 and the nozzle plate 12 to form pressure chambers 14 (FIG. 1). An ink supply pipe 13 is joined to the top plate 10 to connect the pressure chambers 14 to an ink supply unit, not shown. Operation of the ink jet print head thus constructed in jetting the ink from the middle pressure chamber 14, as viewed in FIG. 1, will be described hereinafter. The pressure chambers 14 are filled up with the ink supplied through the ink supply pipe 13 from the ink supply unit. A voltage A is applied through the wiring pattern 9 across the electrodes 8 of the middle pressure chamber 14 and the electrode 8 of the left pressure chamber 14 on the left-hand side of the middle pressure chamber 14, and a voltage B of a polarity reverse to that of the voltage A is applied through the wiring pattern 9 across the electrode 8 of the middle pressure chamber 14 and the electrode 8 of the right pressure chamber 14 on the right-hand side of the middle pressure chamber 14 to apply an electric field of a direction perpendicular to the direction of polarization indicated by the arrows to the upper side walls 4*a*. Consequently, the side wall 4 on the left-hand side of the middle pressure chamber 14 is strained to the left and the side wall 4 of the right-hand side of the middle pressure chamber 14 is strained to the right to increase the volume of the middle pressure chamber 14 and to reduce the respective volumes of the pressure chambers 14 on the opposite sides of the middle pressure chamber 14.

Figure 2:
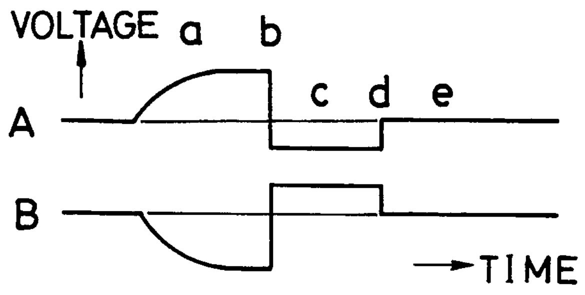
FIG. 2 is a timing chart of assistance in explaining a manner of applying a voltage to the electrode of the ink jet print head of FIG. 1.

Since the voltages A and B are increased gradually in a fixed time period a as shown in FIG. 2, the ink is not jetted through the ink jets 11 of the right and left pressure chambers 14, where the respective volumes are reduced. The level of the ink in the middle pressure chamber 14 is lowered slightly when the volume of the middle pressure chamber 14 is increased, and then the ink is sucked through the ink supply pipe 13 into the middle pressure chamber 14. The polarities of the voltages A and B are reversed instantaneously at time b (FIG. 2) to strain instantaneously the side wall 4 on the left-hand side of the middle pressure chamber 14 to the right and the side wall 4 on the right-hand side of the middle pressure chamber 14 to the left. Consequently, the volume of the middle pressure chamber 14 is reduced sharply to jet the ink through the ink jet 11 of the middle pressure chamber 14. The voltages A and B of the reverse polarities are maintained for a predetermined time period c (FIG. 2). While the ink is thus jetted through the ink jet 11, the droplet of the ink jetted through the ink jet 11 is continuous with the ink jet 11. At time d, the voltages A and B are removed instantaneously from the electrodes 8 to allow the strained side walls 4 to restore their original shapes rapidly. Consequently, the internal pressure of the middle pressure chamber 14 drops sharply and thereby a rear portion of the ink droplet flying in the vicinity of the ink jet 11 is separated from the ink droplet on the axis of the ink jet 11 and is sucked into the middle pressure chamber 14. Thus, the ink droplet flies in a fixed direction and is not separated into a plurality of smaller ink droplets which form satellite dots. Although the internal pressures of the right and left pressure chambers 14 increase at the moment when the voltages A and B are removed from the electrodes 8, the internal pressures do not increase to a pressure level high enough to jet the ink through the ink jets 11.

Thus, the upper side walls 4*a* of the side walls 4 are portions of the piezoelectric plate 2 formed of a piezoelectric material having a high rigidity and the lower side walls 4b of the side walls 4 are portions of the base plate 1 formed of a material having a rigidity lower than that of the piezoelectric material forming the piezoelectric plate 2. Therefore the upper side walls 4a can be strained greatly without being obstructed significantly by the lower side walls 4b to enhance the ink jetting characteristic of the ink jet print head.

Figure 6:
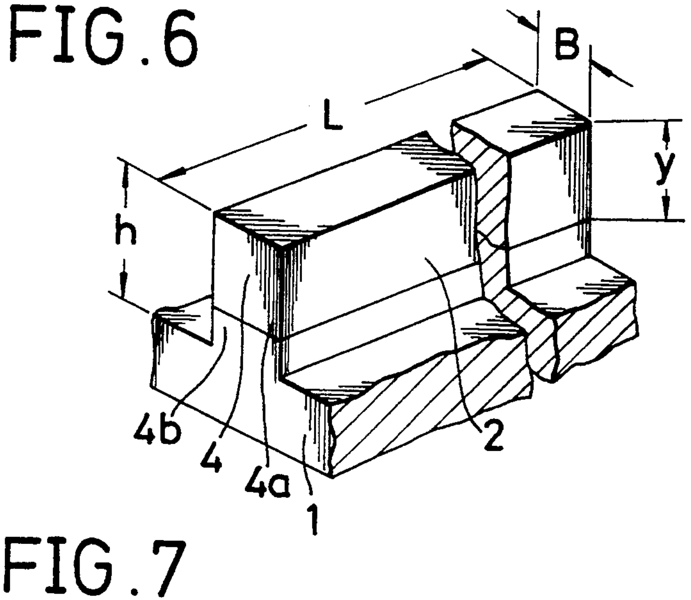
FIG. 6 is a fragmentary perspective view of assistance in explaining the dimensions of side walls of the ink jet print head of FIG. 1.

Incidentally, suppose that each side wall 4 has a height h (the depth of the grooves 3) of 160 μm, a width B of 80 μm and a length L of 10 mm as shown in FIG. 6 and $$d_{15}=564\times10^{-12}\ m/V$$

$$S_{44}=37.4\times10^{-12}\ m^2/N$$

where $d_{15}$ is the piezoelectric constant of the piezoelectric plate 2 and $S_{44}$ is the elastic constant of the piezoelectric plate.

Figure 7:
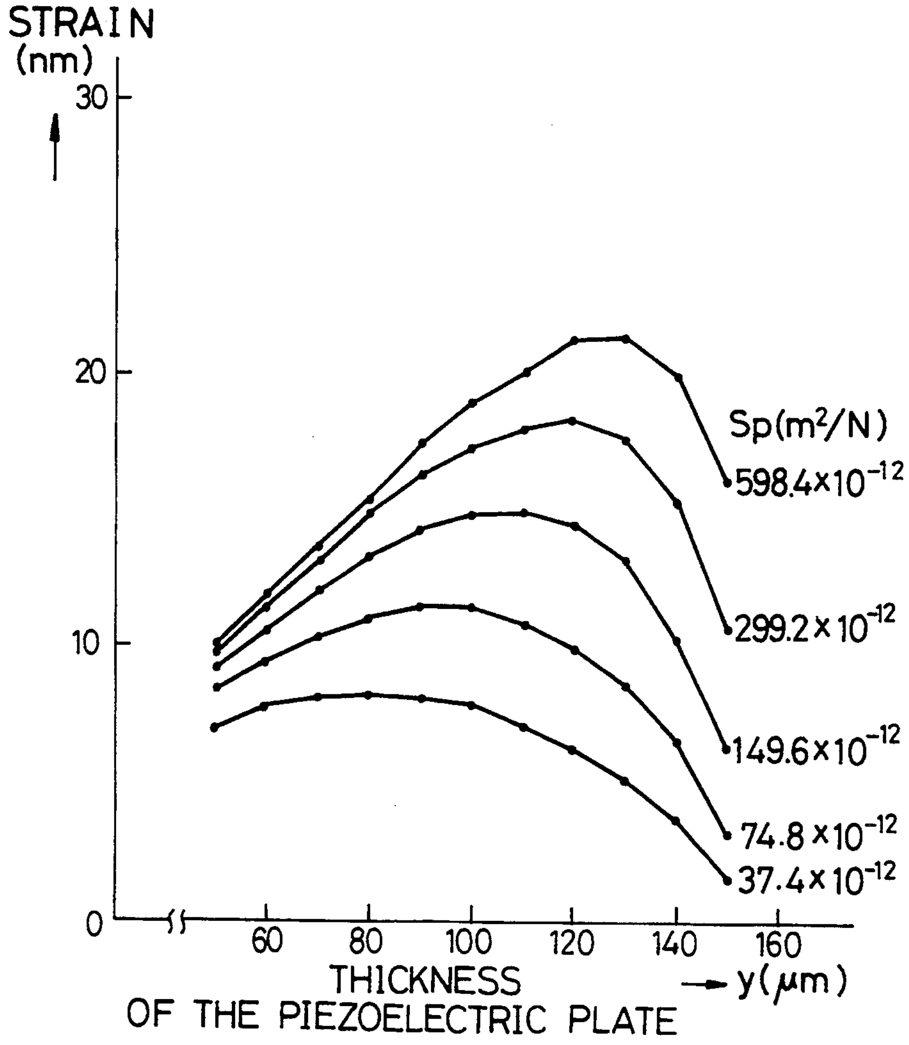
FIG. 7 is a graph showing the variation of strain in a piezoelectric plate with the thickness of the piezoelectric plate for the elastic constant of the piezoelectric plate.
Figure 8:
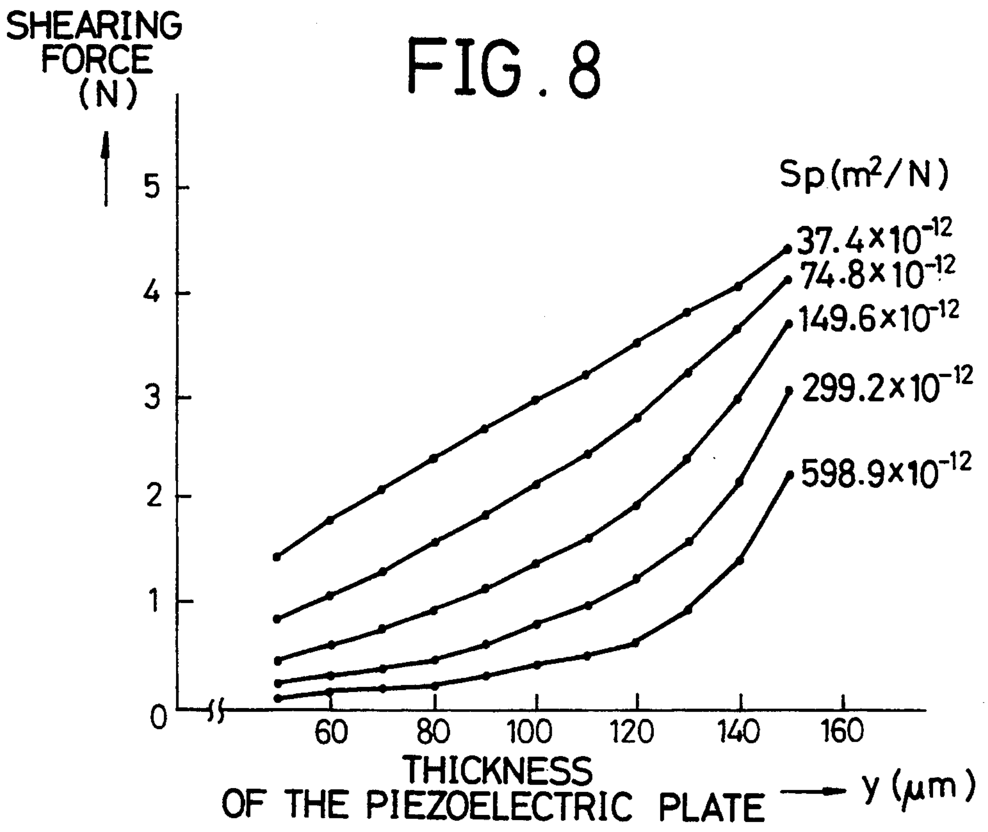
FIG. 8 is a graph showing the variation of shearing force with the thickness of the piezoelectric plate for the elastic constant of the piezoelectric plate.
Figure 9:
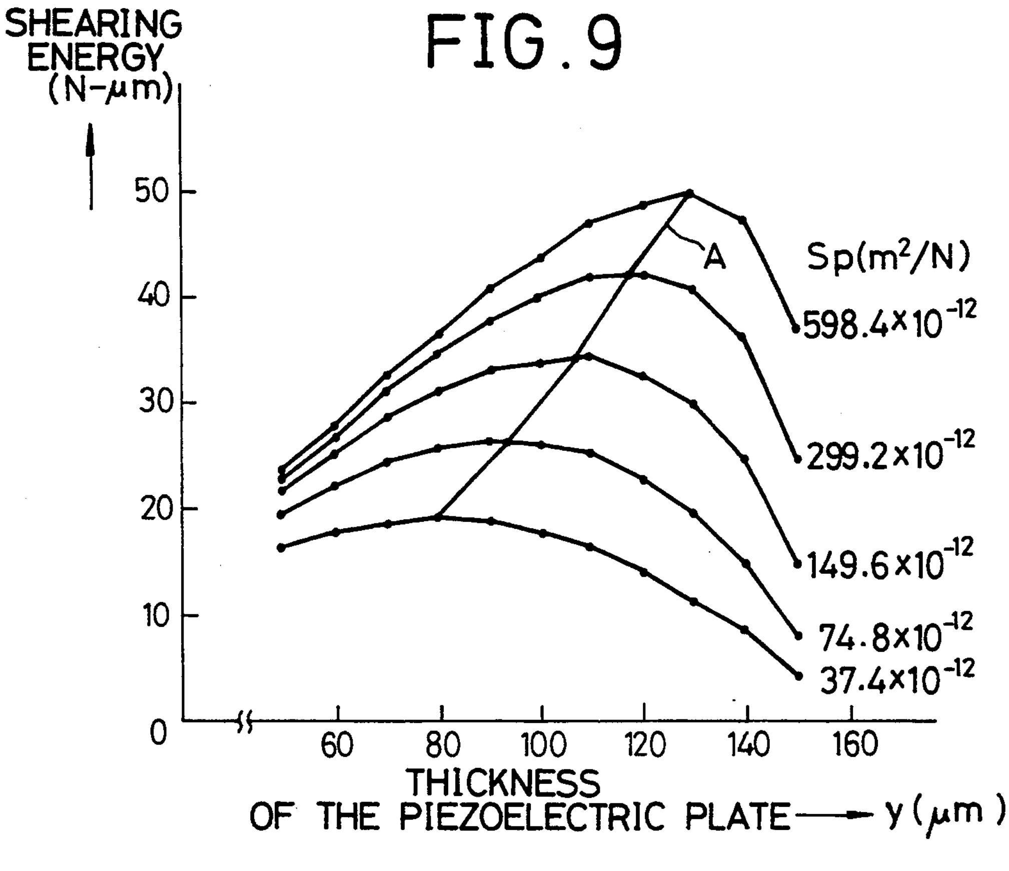
FIG. 9 is a graph showing the variation of energy with the thickness of the piezoelectric plate for the elastic constant of the piezoelectric plate.
Figure 10:
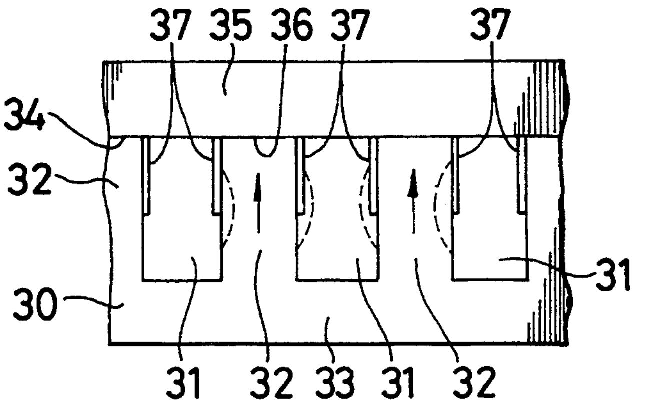
FIG.10 (PRIOR ART)
FIG. 10 is a longitudinal sectional view of a conventional ink jet print head.
Figure 11:
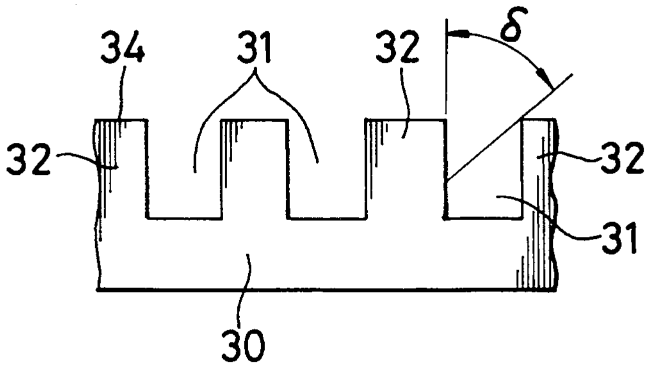
FIG.11 (PRIOR ART)
FIG. 11 is a side view of assistance in explaining a manner of forming electrodes of the ink jet print head of FIG. 10.
Figure 12A:
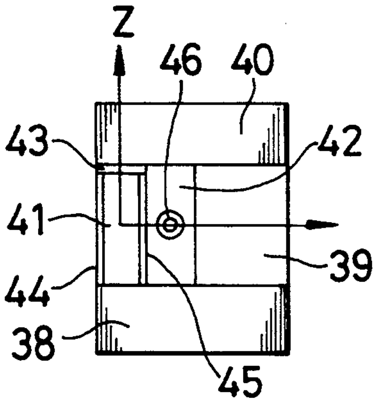
FIG.12(a) (PRIOR ART)
FIGS. 12(*a*) and 12(*b*) is a longitudinal sectional view of another conventional ink jet print head.
Figure 12B:
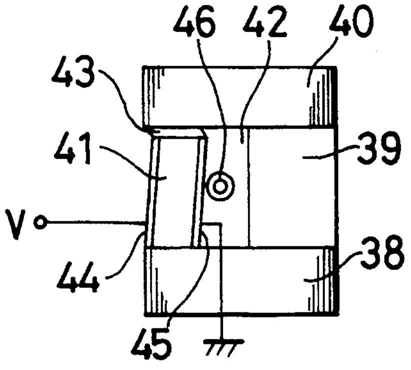
FIG.12(b) (PRIOR ART)

The variation of the strain of the side wall 4 (FIG. 7), the variation of shearing force acting on the side wall 4 (FIG. 8) and the variation of strain energy stored in the side wall 4 with the thickness y of the piezoelectric plate 2 (FIG. 9) for the elastic constant $S_p$ (the reciprocal of rigidity) of the adhesive layer 15 will be examined. In FIGS. 7, 8 and 9, curves for $S_p=37.4\times10^{-12}$ m²/N represent the characteristics of the side wall of the conventional ink jet print head, in which the side wall is formed entirely of the material forming the piezoelectric plate. As is obvious from FIG. 7, the strain of the side wall 4 is larger, namely, the efficiency of straining the side wall 4 is higher, for the larger elastic constant $S_p$ of the adhesive layer 15. Thus, the elastic constant $S_p$ of the adhesive layer 15, the height h of the side wall (the depth of the grooves 3) and the thickness y of the piezoelectric plate 2 are determined selectively to obtain an ink jet print head having optimum strain, shearing and energy characteristics.

Referring to FIG. 9, every energy-thickness curve for elastic constant $S_p$ of the adhesive layer 15 has a maximum. In FIG. 9, a curve indicated at A indicates the maxima of the curves. The thickness y of the piezoelectric plate 2 corresponding to the maximum is expressed as a function of the height h of the side wall 4 (the depth of the grooves 3), the elastic constant $S_{44}$ of the piezoelectric plate 2 and the elastic constant $S_p$ (reciprocal of the rigidity) of the adhesive layer 15.

$$y=\frac{S_ph-\sqrt{(S_ph)^2-(S_p-S_{44})S_ph^2}}{(S_p-S_{44})}$$

The piezoelectric plate 2 is designed in a thickness approximately equal to the thickness y calculated by using this expression to obtain an ink jet print head provided with the side walls 4 capable of being deformed greatly, and having an enhanced ink jetting characteristic. Since the adhesive layer 15 is formed over the surface of the base plate 1 having a high rigidity and the piezoelectric plate 2 is put on the adhesive layer 15, the grooves 3 can be formed in the depth h with a small allowance. Therefore, the side walls 4 are uniform in straining characteristic and the pressure chambers are uniform in ink jetting characteristic.

Since the lower portions of the side walls 4, namely, the lower side walls 4b, are formed of the nonelectrostrictive adhesive layer 15, an electric field acts only on the upper side walls 4a formed in the piezoelectric plate 2 even if the electrodes 8 are formed entirely over the bottom surfaces of the grooves 3 and the side surfaces of the side walls 4 including the side surfaces of the lower side walls 4b. Accordingly, the electrodes 8 can be formed by an inexpensive electroless plating process. The electroless plating is capable of forming the electrodes 8 having few pinholes in a uniform thickness over the irregular ground surfaces of the grooves 3. Therefore, an electric field can be applied uniformly to the piezoelectric plate 2. The surfaces of the pressure chambers 14 formed in the adhesive layer 15 and the piezoelectric plate 2 are protected from the corrosive action of the ink by the electrodes 8 having few pinholes and entirely coating the surfaces of the pressure chambers 14. Therefore, additional protective films may be omitted to reduce the cost of the ink jet print head.

The components of the adhesive forming the adhesive layer 15 will be described hereinafter. The piezoelectric plate 2 is a sintered member having minute pores in its surface and, on the other hand, irregularities are formed in the surfaces of the adhesive layer 15 exposed in the grooves 3 in forming the grooves 3 by grinding. In forming the electrodes 8 by electroless plating, the metal deposited in the minute pores in the piezoelectric plate 2 serves as anchors to enhance the adhesion of the electrodes 8 to the piezoelectric plate 2. However, the metal deposited in the exposed irregular surfaces of the adhesive layer 15 are necessarily able to serve as anchors. Accordingly, the adhesive layer 15 is formed of an adhesive containing particles of a material, such as sodium sulfate, easy to be dissolved in the chemical liquid, such as the accelerator used for the pretreatment of the work before electroless plating, in a concentration of the order of 6% by weight. The particles of the material dispensed in the exposed surfaces of the adhesive layer 15 are dissolved in the chemical liquid during pretreatment to form minute pores in the exposed surfaces of the adhesive layer 15 to enable the metal deposited in the minute pores to serve as anchors which enhances the adhesion of the electrodes 8.

There is a tendency that the metal is deposited over the surfaces of the adhesive layer forming the bottom surfaces of the grooves 3 in a thickness than that of the metal layers formed on the side surfaces of the grooves 3 in forming the electrodes 8 by electroless plating. Therefore, the adhesive layer 15 is formed of an adhesive containing Pd particles of 1 μm or less in particle size in a concentration in the range of 2 to 5% by weight. The Pd particles exposed in the bottom surfaces of the grooves 3 are activated by the accelerator during electroless plating to accelerate the deposition of the metal so that the metal is deposited uniformly over the entire surfaces of the grooves 3. Although Pd is conductive, the adhesive layer 15 does not become conductive because the density of the Pd particles in the adhesive layer 15 is very small.

Furthermore, the use of an adhesive containing both particles of sodium sulfate readily dissolvable in the chemical liquid for the pretreatment and particles of Pd which serves as a catalyst further enhances the adhesion of the electrodes 8. Particles of rhodium, silver or gold may be used instead of Pd particles.

As stated above, the ink jet print head in the first aspect of the present invention comprises: the flat base plate having a high rigidity and resistant to thermal deformation; the adhesive layer formed of an adhesive on the base plate and provided with grooves separated from each other by the lower side walls; the piezoelectric plate polarized in the direction of its thickness, provided with slots separated from each other by the upper side walls, and joined to the adhesive layer so that the slots coincide respectively with the grooves of the adhesive layer and the upper side walls are connected respectively to the lower side walls to form side walls defining the grooves; the top plate attached to the upper surface of the piezoelectric plate so as to close the upper open ends of the grooves; the electrodes formed by depositing the metal over the surfaces of the grooves; and the nozzle plate provided with the ink jets and attached to one end of the assembly of the base plate, the adhesive layer, the piezoelectric plate and the top plate so as to close the open longitudinal ends of the grooves to form the pressure chambers. Voltages are applied across the electrodes to jet the ink through the ink jet of the pressure chamber by changing the volume of the pressure chamber and increasing the internal pressure of the pressure chamber. Since the upper side wall of each side wall is formed of a portion of the piezoelectric plate having a high rigidity, and the lower side wall of the same side wall is formed of a portion of the adhesive layer having a rigidity lower than that of the piezoelectric plate, the resistance of the lower side wall against the straining of the upper side wall is not significantly large, so that the side wall can greatly be strained to enhance the ink jetting characteristic of the ink jet print head. Since the adhesive layer is formed on the base plate having a high rigidity, and the piezoelectric plate is put on the adhesive layer, the grooves are formed in a uniform depth with a small allowance, which further enhances the straining characteristic of the side walls and the ink jetting characteristic of the ink jet print head.

The method of fabricating an ink jet print head in a second aspect of the present invention comprises steps of: forming an adhesive layer in a uniform thickness over one major surface of the base plate having a high rigidity and resistant to thermal deformation; joining the piezoelectric plate polarized in the direction of its thickness to the adhesive layer; hardening the adhesive layer; forming the grooves through the piezoelectric plate into the adhesive layer by grinding; depositing the metal over the entire inner surfaces of the grooves by electroless plating to form the electrodes; attaching the top plate to the upper surface of the piezoelectric plate so as to close the upper open ends of the grooves; and joining the nozzle plate provided with the ink jets to one end of the assembly of the base plate, the adhesive layer, the piezoelectric plate and the top plate so as to close the longitudinal ends of the grooves to form the pressure chambers. The electrodes having few pinholes can be formed in a uniform thickness over the surfaces of the grooves even if the portions of the surfaces of the grooves formed by grinding in the piezoelectric plate are irregular surfaces, so that an electric field can uniformly be applied to the piezoelectric plate. The electrodes having few pinholes protects the inner surfaces of the pressure chambers from the corrosive action of the ink, and enables the omission of any additional protective films to reduce the cost of the ink jet print head.

The method of fabricating an ink jet print head in the third aspect of the present invention forms the adhesive layer by an adhesive containing particles of a material readily soluble in the chemical liquid, and etches the surfaces of the lower side walls formed of the adhesive layer before forming the electrodes by electroless plating in order that the particles are dissolved in the chemical liquid to form minute pores in the side surfaces of the lower side walls formed of the adhesive layer. The metal deposited by electroless plating in the minute pores serves as anchors to enhance the adhesion of the electrodes.

The method of fabricating an ink jet print head in the fourth aspect of the present invention employs the adhesive layer formed of an adhesive containing a catalyst necessary for electroless plating. The catalyst makes the metal to be deposited thereon to improve the adhesion of the electrodes.

The method of fabricating an ink jet print head in the fifth aspect of the present invention applies a catalyst for electroless plating over the surfaces of the grooves formed through the piezoelectric plate into the adhesive layer and the surface of the piezoelectric plate, covers the surface of the piezoelectric plate excluding portions of the surface of the piezoelectric plate in which the wiring pattern is to be formed with a mask formed by a photolithographic process, immerses the work in the electroless plating bath to form the electrodes and the wiring pattern simultaneously. Thus, the electrodes and the wiring pattern connecting with the electrodes are formed simultaneously to reduce the steps of fabricating the ink jet print head.

What is claimed is:

1. A method of fabricating an ink jet print head, comprising steps of: spreading an adhesive over one major surface of a flat base plate having a relatively high rigidity and resistant to thermal deformation to form an adhesive layer of a predetermined thickness; joining a piezoelectric plate polarized in a direction of thickness to the adhesive layer; hardening the adhesive layer; forming a plurality of parallel grooves through the piezoelectric plate into the adhesive layer by grinding such that said plurality of parallel grooves include side surfaces which extend through the piezoelectric plate and into the adhesive layer with said plurality of parallel grooves each having a bottom surface located in said adhesive layer; forming electrodes by depositing a metal over the side and bottom surfaces of the grooves by electroless plating; attaching a top plate to the upper surface of the piezoelectric plate so as to close the upper open end of the grooves; attaching a nozzle plate provided with a plurality of ink jets to one end of the assembly of the base plate, the adhesive layer, the piezoelectric plate and the top plate so that the grooves are closed to form a plurality of pressure chambers and the pressure chambers can be connected to an ink supply unit, and wherein deformation of said side surfaces is enhanced upon application of a voltage to said electrodes as a result of said grooves extending into said adhesive layer.

2. A method of fabricating an ink jet print head according to claim 1, wherein the adhesive forming the adhesive layer contains particles of a material readily soluble in a chemical liquid, the inner surfaces of the grooves are etched before forming the electrodes by electroless plating.

3. A method of fabricating an ink jet print head according to claim 1 or 2, wherein the adhesive forming the adhesive layer contains a catalyst for electroless plating.

4. A method of fabricating an ink jet print head according to claim 1 or 2, wherein a catalyst for electroless plating is applied to the upper surface of the piezoelectric plate and the surfaces of the grooves, the upper surface of the piezoelectric plate excluding portions in which a wiring pattern is to be formed and the surfaces of the grooves are coated with a mask formed by a photolithographic process, the assembly of the base plate, the adhesive layer and the piezoelectric plate is immersed in an electroless plating bath to form the wiring pattern and the electrodes simultaneously.

* * * * *